United States Patent

Chen et al.

(10) Patent No.: US 10,630,287 B2
(45) Date of Patent: Apr. 21, 2020

(54) RADIO FREQUENCY DEVICE AND VOLTAGE GENERATING CIRCUIT THEREOF

(71) Applicant: RichWave Technology Corp., Taipei (TW)

(72) Inventors: Chih-Sheng Chen, Taipei (TW); Ming-Shiuan Wen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/166,177

(22) Filed: Oct. 22, 2018

(65) Prior Publication Data

US 2020/0052693 A1  Feb. 13, 2020

(30) Foreign Application Priority Data

Aug. 10, 2018  (TW) .............................. 107127929 A (51) Int. Cl.
| | | |
|---|---|---|
| H03K 17/693 | (2006.01) | |
| H04B 1/48 | (2006.01) | |
| H03K 17/00 | (2006.01) | |

(52) U.S. Cl.
CPC ......... *H03K 17/693* (2013.01); *H03K 17/007* (2013.01); *H04B 1/48* (2013.01)

(58) Field of Classification Search
CPC ...... H03K 17/693; H03K 17/007; H04B 1/48; H04B 2001/485
See application file for complete search history.

(56) References Cited

U.S. PATENT DOCUMENTS

| | | | |
|---|---|---|---|
| 3,942,039 | A | 3/1976 | Kikuchi et al. |
| 5,717,356 | A | 2/1998 | Kohama |
| 5,818,099 | A | 10/1998 | Burghartz |
| 7,173,471 | B2 | 2/2007 | Nakatsuka et al. |
| 7,460,852 | B2 | 12/2008 | Burgener et al. |
| 7,796,969 | B2 | 9/2010 | Kelly et al. |
| 8,093,940 | B2 | 1/2012 | Huang et al. |
| 9,231,578 | B2 | 1/2016 | Chih-Sheng |
| 9,543,929 | B2 | 1/2017 | Chen |
| 2004/0229577 | A1 | 11/2004 | Struble |

(Continued)

FOREIGN PATENT DOCUMENTS

| | | |
|---|---|---|
| EP | 0720292 | 7/1996 |
| EP | 1487103 | 12/2004 |

(Continued)

OTHER PUBLICATIONS

"Office Action of Taiwan Counterpart Application," dated Feb. 13, 2019, p. 1-p. 9.

(Continued)

*Primary Examiner* — Patrick C Chen
(74) *Attorney, Agent, or Firm* — JCIPRNET (57) ABSTRACT

A radio frequency (RF) device and its voltage generating circuit are provided. The RF device includes the voltage generating circuit and a RF circuit. The voltage generating circuit receives a RF signal and generates at least one bias voltage related to the RF signal. The RF circuit is used to receive the RF signal. The RF circuit is coupled to the voltage generating circuit to receive the bias voltage. The bias voltage is used to operate the conduction state of at least one RF transmission path of the RF circuit.

18 Claims, 6 Drawing Sheets

(56) References Cited

U.S. PATENT DOCUMENTS

| | | | |
|---|---|---|---|
| 2006/0001473 A1 | 1/2006 | Yasuda et al. | |
| 2011/0254614 A1 | 10/2011 | Huang et al. | |
| 2015/0105032 A1* | 4/2015 | Wang .................. | H03K 17/161 455/77 |
| 2018/0061984 A1 | 3/2018 | Achiriloaie et al. | |
| 2018/0175851 A1 | 6/2018 | Kerr et al. | |

FOREIGN PATENT DOCUMENTS

| | | |
|---|---|---|
| JP | 2000223902 | 8/2000 |
| JP | 2001068984 | 3/2001 |
| TW | 200744315 | 12/2007 |
| TW | 200947902 | 11/2009 |
| TW | 201330500 | 7/2013 |
| WO | 2007136050 | 11/2007 |
| WO | 2012070162 | 5/2012 |

OTHER PUBLICATIONS

"Search Report of Europe Counterpart Application", dated Dec. 11, 2019, pp. 1-8.

* cited by examiner

RADIO FREQUENCY DEVICE AND VOLTAGE GENERATING CIRCUIT THEREOF

CROSS-REFERENCE TO RELATED APPLICATION

This application claims the priority benefit of Taiwan application serial no. 107127929, filed on Aug. 10, 2018. The entirety of the above-mentioned patent application is hereby incorporated by reference herein and made a part of this specification.

BACKGROUND

Technical Field

The disclosure relates to an electrical circuit, and particularly relates to a radio frequency (RF) device and a voltage generating circuit thereof.

Description of Related Art

In many radio frequency (RF) electronic products (such as mobile phones, wireless pagers, wireless infrastructure, satellite communication devices, television equipment, and/or other RF products), RF circuits such as RF switches are very important components. Generally speaking, a RF switch requires a bias voltage for operating the conduction state of a RF transmission path of a RF switch.

SUMMARY

An embodiment of the disclosure provides a RF device. The RF device includes a voltage generating circuit and a RF circuit. The voltage generating circuit receives a RF signal and generates at least one bias voltage related to the RF signal. The RF circuit is adapted to receive the RF signal. The RF circuit is coupled to the voltage generating circuit to receive the bias voltage. The bias voltage is adapted to operate a conduction state of at least one RF transmission path of the RF circuit.

An embodiment of the disclosure provides a voltage generating circuit. The voltage generating circuit includes an input terminal and at least one output terminal. The input terminal is adapted to receive a RF signal. The at least one output terminal is adapted to generate at least one bias voltage related to the RF signal and provide the at least one bias voltage to a RF circuit. The bias voltage is adapted to operate a conduction state of at least one RF transmission path of the RF circuit.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The term "couple (or connect)" as used throughout this specification (including the claims) may be referred to any direct or indirect connection means. For example, if it is described that the first device is coupled (or connected) to the second device, it should be understood that the first device may be directly connected to the second device or indirectly connected to the second device through other devices or certain connection means. Moreover, wherever possible, the elements/components/steps with the same reference numerals represent the same or similar parts in the figures and embodiments. Descriptions of the elements/components/steps with the same reference numerals or terms in different embodiments may be reference for one another.

Figure 1:
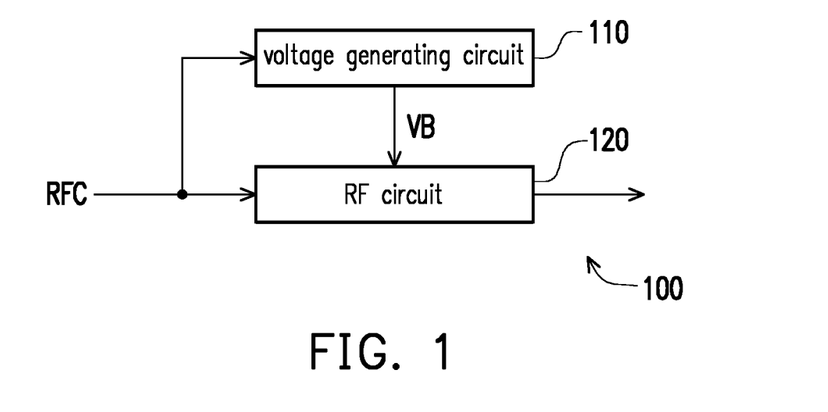
FIG. 1 is a circuit block diagram of a RF device according to an embodiment of the disclosure.

FIG. 1 is a circuit block diagram of a radio frequency (RF) device 100 according to an embodiment of the disclosure. The RF device 100 includes a voltage generating circuit 110 and a RF circuit 120. According to design requirements, the RF circuit 120 may be a RF switch or another RF component/circuit with a RF transmission path. The RF switch may be a conventional RF switch or another switching component/circuit. The RF circuit 120 receives a RF signal RFC. The RF transmission path of the RF circuit 120 may determine whether to transmit the RF signal RFC to a next-stage circuit (not shown).

An input terminal of the voltage generating circuit 110 receives the RF signal RFC. An output terminal of the voltage generating circuit 110 may generate at least one bias voltage VB. The bias voltage VB is related to the RF signal RFC. The RF circuit 120 is coupled to the voltage generating circuit 110 to receive the bias voltage VB. The bias voltage VB is used to operate the conduction state of at least one RF transmission path of the RF circuit 120.

Figure 2:
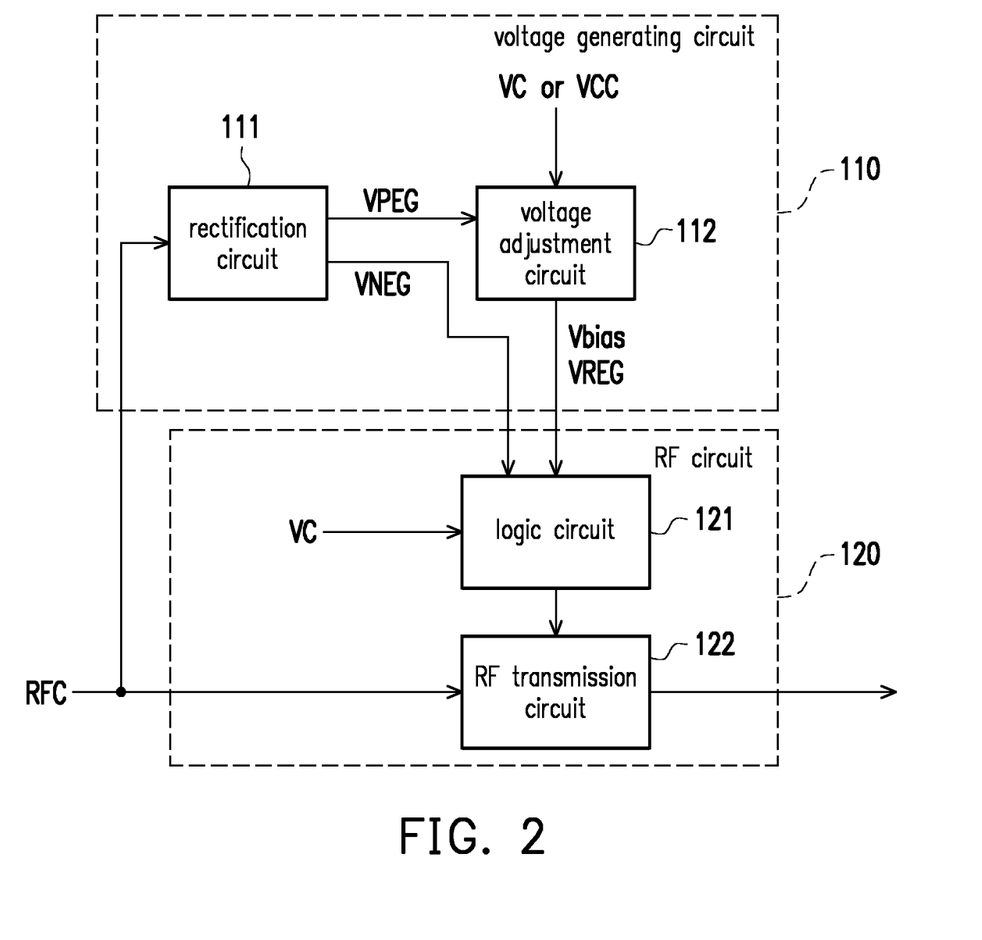
FIG. 2 is a circuit block diagram of the voltage generating circuit and the RF circuit in FIG. 1 according to an embodiment of the disclosure.

FIG. 2 is a circuit block diagram of the voltage generating circuit 110 and the RF circuit 120 in FIG. 1 according to an embodiment of the disclosure. In the embodiment shown in FIG. 2, the voltage generating circuit 110 includes a rectification circuit 111 and a voltage adjustment circuit 112. The rectification circuit 111 may receive the RF signal RFC. The rectification circuit 111 generates at least one auxiliary voltage related to the RF signal RFC (e.g., one or more of VPEG and VNEG shown in FIG. 2). For example, the at least one auxiliary voltage may include an auxiliary voltage VPEG and/or an auxiliary voltage VNEG, and the auxiliary voltage VPEG and/or the auxiliary voltage VNEG may be a rectified DC voltage. The auxiliary voltage VPEG is, for example, an upper half-wave auxiliary voltage, and is related to an upper half-wave part of the RF signal RFC. The auxiliary voltage VNEG is, for example, a lower half-wave auxiliary voltage, and is related to a lower half-wave part of the RF signal RFC.

The voltage adjustment circuit 112 is coupled to the rectification circuit 111 to receive the auxiliary voltage VPEG. The voltage adjustment circuit 112 may generate a first bias voltage Vbias and/or a second bias voltage VREG of the bias voltage (i.e., the bias voltage VB shown in FIG. 1) and provide the first bias voltage Vbias and/or a second bias voltage VREG to the RF circuit 120. Wherein, the first bias voltage Vbias and the second bias voltage VREG are related to the auxiliary voltage VPEG, that is, the first bias voltage Vbias and the second bias voltage VREG are related to the RF signal RFC.

In some embodiments, the voltage adjustment circuit 112 may generate the first bias voltage Vbias and/or the second bias voltage VREG according to the auxiliary voltage VPEG and a system voltage VCC, and provide the first bias voltage Vbias and/or the second bias voltage VREG to the RF circuit 120. For example, the voltage adjustment circuit 112 may output one of the system voltage VCC and the auxiliary voltage VPEG which has a higher voltage to the RF circuit 120 to serve as the first bias voltage Vbias and/or the second bias voltage VREG. The system voltage VCC may supply power to different components of the entire system, and its level may be determined according to system design requirements. An example of implementing the voltage adjustment circuit 112 will be described in detail later with reference to FIG. 4 and FIG. 6.

In some other embodiments, the voltage adjustment circuit 112 may generate the first bias voltage Vbias and/or the second bias voltage VREG according to the auxiliary voltage VPEG and a control signal VC, and provide the first bias voltage Vbias and/or the second bias voltage VREG to the RF circuit 120. The control signal VC may control the RF circuit 120 to determine the conduction state of the RF transmission path. According to the design of the RF transmission path of the RF circuit 120, the control signal VC may include one or more control signals. For example, if the control signal VC includes a plurality of control signals, the voltage adjustment circuit 112 may output one of the control signals and the auxiliary voltage VPEG which has a higher voltage to the RF circuit 120 to serve as the first bias voltage Vbias and/or the second bias voltage VREG. An example of implementing the voltage adjustment circuit 112 will be described in detail later with reference to FIG. 5 and FIG. 7.

In the embodiment shown in FIG. 2, the RF circuit 120 includes a logic circuit 121 and a RF transmission circuit 122. The logic circuit 121 is coupled to the voltage generating circuit 110 to receive the bias voltage (that is, the bias voltage VB shown in FIG. 1, e.g., one or more of Vbias, VREG and VNEG shown in FIG. 2). The logic circuit 121 controls the conduction state of the RF transmission path in the RF transmission circuit 122 according to at least one control signal VC. The RF transmission circuit 122 receives the RF signal RFC, and may determine whether to transmit the RF signal RFC via the RF transmission path based on the control of the logic circuit 121.

Figure 3:
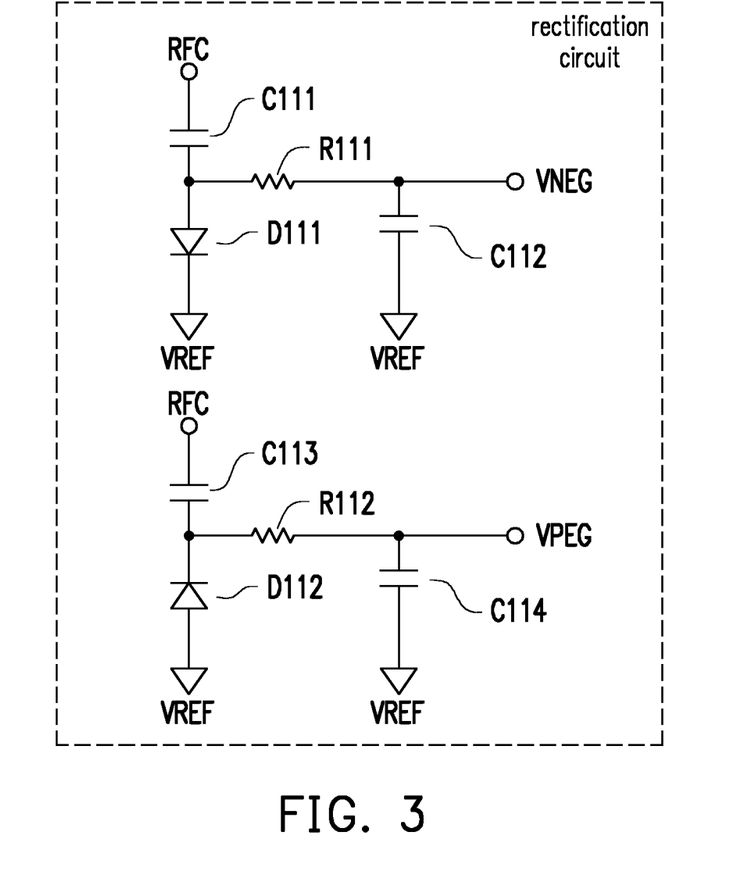
FIG. 3 is a circuit block diagram of the rectification circuit in FIG. 2 according to an embodiment of the disclosure.

FIG. 3 is a circuit block diagram of the rectification circuit 111 in FIG. 2 according to an embodiment of the disclosure. In the embodiment shown in FIG. 3, the rectification circuit 111 includes a capacitor C111, a diode D111, a resistor R111 and a capacitor C112. A first terminal of the capacitor C111 is coupled to the RF signal RFC. An anode of the diode D111 is coupled to a second terminal of the capacitor C111. A cathode of the diode D111 is coupled to a reference voltage VREF. According to design requirements, the reference voltage VREF may also be a ground voltage or another fixed voltage. A first terminal of the resistor R111 is coupled to the second terminal of the capacitor C111. A second terminal of the resistor R111 is coupled to a first terminal of the capacitor C112. A second terminal of the capacitor C112 is coupled to the reference voltage VREF. Wherein, the second terminal of the resistor R111 provides the auxiliary voltage VNEG to the RF circuit 120 to serve as a third bias voltage of the bias voltage VB.

In the embodiment shown in FIG. 3, the rectification circuit 111 may also include a capacitor C113, a diode D112, a resistor R112 and a capacitor C114. A first terminal of the capacitor C113 is coupled to the RF signal RFC. A cathode of the diode D112 is coupled to a second terminal of the capacitor C113. An anode of the diode D112 is coupled to the reference voltage VREF. A first terminal of the resistor R112 is coupled to the second terminal of the capacitor C113. A second terminal of the resistor R112 is coupled to a first terminal of the capacitor C114. A second terminal of the capacitor C114 is coupled to the reference voltage VREF. Wherein, the second terminal of the resistor R112 provides the auxiliary voltage VPEG to the voltage adjustment circuit 112. In one embodiment, the auxiliary voltage VPEG is a positive voltage, and the auxiliary voltage VNEG is a negative voltage.

Figure 4:
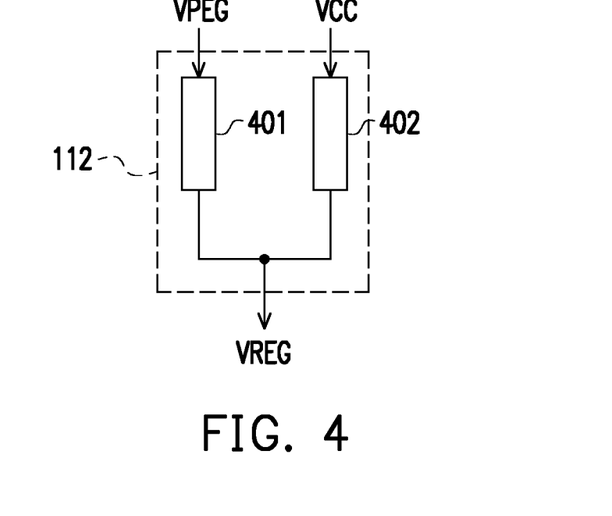
FIG. 4 is a circuit block diagram of the voltage adjustment circuit in FIG. 2 according to an embodiment of the disclosure.

FIG. 4 is a circuit block diagram of the voltage adjustment circuit 112 in FIG. 2 according to an embodiment of the disclosure. In the embodiment shown in FIG. 4, the voltage adjustment circuit 112 includes a voltage dividing component 401 and a voltage dividing component 402. According to design requirements, each of the voltage dividing component 401 and the voltage dividing component 402 may include a resistor, a set of series resistors, a diode or a set of series diodes. A first terminal of the voltage dividing component 401 is coupled to the rectification circuit 111 to receive the auxiliary voltage VPEG. A first terminal of the voltage dividing component 402 receives the system voltage VCC. A second terminal of the voltage dividing component 402 is coupled to a second terminal of the voltage dividing component 401. The second terminal of the voltage dividing component 401 may provide the second bias voltage VREG to the RF circuit 120. Therefore, when the auxiliary voltage VPEG is not ready (i.e., the RF signal RFC is non-existent, or the voltage of the RF signal RFC is insufficient), the system voltage VCC may be selected to generate the second bias voltage VREG. When the auxiliary voltage VPEG is ready, the auxiliary voltage VPEG may be selected to generate the second bias voltage VREG.

Figure 5:
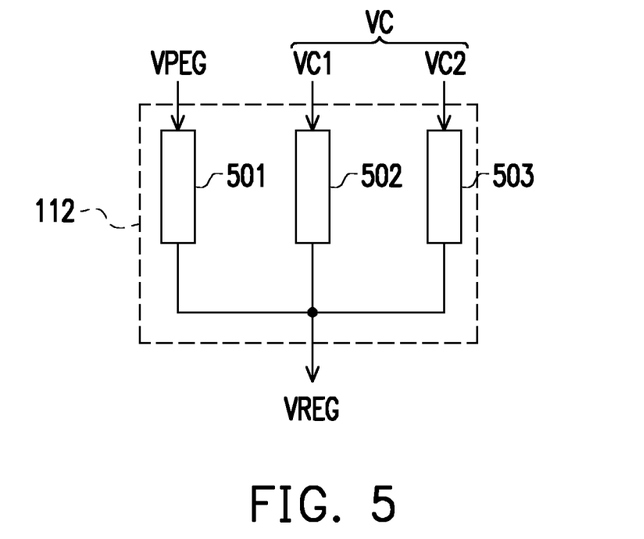
FIG. 5 is a circuit block diagram of the voltage adjustment circuit in FIG. 2 according to another embodiment of the disclosure.

FIG. 5 is a circuit block diagram of the voltage adjustment circuit 112 in FIG. 2 according to another embodiment of the disclosure. The voltage adjustment circuit 112 includes a voltage dividing component 501, a voltage dividing component 502 and a voltage dividing component 503. A first terminal of the voltage dividing component 501 is coupled to the rectification circuit 111 to receive the auxiliary voltage VPEG. In the embodiment shown in FIG. 5, the control signal VC includes two control signals VC1 and VC2. In other embodiments, by analogy, the control signal VC may include more control signals, so that the voltage adjustment circuit 112 may be provided with more voltage dividing components to receive the control signals respectively.

According to design requirements, each of the voltage dividing component 501, the voltage dividing component 502 and the voltage dividing component 503 may include a resistor, a set of series resistors, a diode or a set of series diodes. A first terminal of the voltage dividing component 502 receives the control signal VC1. A second terminal of the voltage dividing component 502 is coupled to a second terminal of the voltage dividing component 501. A first terminal of the voltage dividing component 503 receives the control signal VC2. A second terminal of the voltage dividing component 503 is coupled to the second terminal of the voltage dividing component 501. The second terminal of the voltage dividing component 501 provides the second bias voltage VREG to the RF circuit 120. Therefore, when the auxiliary voltage VPEG is not ready, the control signal VC1 and/or the control signal VC2 may be selected to generate the second bias voltage VREG. When the auxiliary voltage VPEG is ready, the auxiliary voltage VPEG may be selected to generate the second bias voltage VREG.

Figure 6:
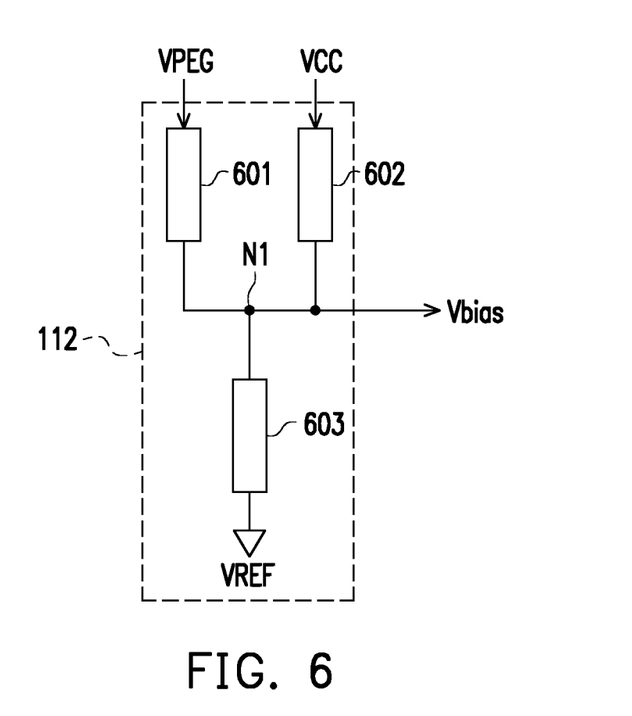
FIG. 6 is a circuit block diagram of the voltage adjustment circuit in FIG. 2 according to yet another embodiment of the disclosure.

FIG. 6 is a circuit block diagram of the voltage adjustment circuit 112 in FIG. 2 according to yet another embodiment of the disclosure. In the embodiment shown in FIG. 6, the voltage adjustment circuit 112 includes a voltage dividing component 601, a voltage dividing component 602 and a voltage dividing component 603. Each of the voltage dividing component 601, the voltage dividing component 602 and the voltage dividing component 603 may include a resistor, a set of series resistors, a diode or a set of series diodes.

A first terminal of the voltage dividing component 601 is coupled to the rectification circuit 111 to receive the auxiliary voltage VPEG. A second terminal of the voltage dividing component 601 is coupled to a voltage dividing node N1. The voltage dividing node N1 provides the first bias voltage Vbias to the RF circuit 120. A first terminal of the voltage dividing component 602 receives the system voltage VCC. A second terminal of the voltage dividing component 602 is coupled to the voltage dividing node N1. A first terminal of the voltage dividing component 603 is coupled to the voltage dividing node N1. A second terminal of the voltage dividing component 603 is coupled to the reference voltage VREF. Therefore, when the auxiliary voltage VPEG is not ready, the system voltage VCC may be divided to generate the first bias voltage Vbias. When the auxiliary voltage VPEG is ready, the auxiliary voltage VPEG may be divided to generate the first bias voltage Vbias.

Figure 7:
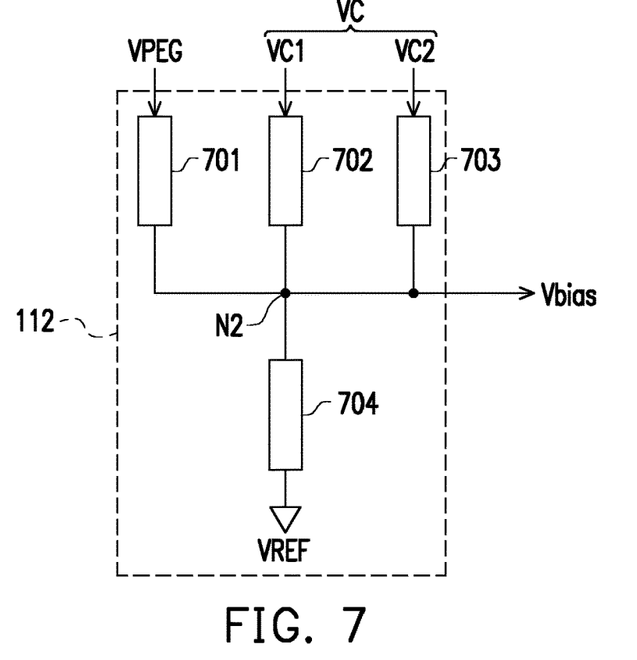
FIG. 7 is a circuit block diagram of the voltage adjustment circuit in FIG. 2 according to still another embodiment of the disclosure.

FIG. 7 is a circuit block diagram of the voltage adjustment circuit 112 in FIG. 2 according to still another embodiment of the disclosure. In the embodiment shown in FIG. 7, the voltage adjustment circuit 112 includes a voltage dividing component 701, a voltage dividing component 702, a voltage dividing component 703 and a voltage dividing component 704. According to design requirements, each of the voltage dividing component 701, the voltage dividing component 702, the voltage dividing component 703 and the voltage dividing component 704 may include a resistor, a set of series resistors, a diode or a set of series diodes. A first terminal of the voltage dividing component 701 is coupled to the rectification circuit 111 to receive the auxiliary voltage VPEG. In the embodiment shown in FIG. 7, the control signal VC includes two control signals VC1 and VC2. In other embodiments, by analogy, the control signal VC may include more control signals, so that the voltage adjustment circuit 112 may be provided with more voltage dividing components to receive the control signals respectively.

A first terminal of the voltage dividing component 702 receives the control signal VC1. A first terminal of the voltage dividing component 703 receives the control signal VC2. A second terminal of the voltage dividing component 701, a second terminal of the voltage dividing component 702 and a second terminal of the voltage dividing component 703 are jointly coupled to a voltage dividing node N2. The voltage dividing node N2 provides the first bias voltage Vbias to the RF circuit 120. A first terminal of the voltage dividing component 704 is coupled to the voltage dividing node N2. A second terminal of the voltage dividing component 704 is coupled to the reference voltage VREF. Therefore, when the auxiliary voltage VPEG is not ready, the control signal VC1 and/or the control signal VC2 may be divided to generate the first bias voltage Vbias. When the auxiliary voltage VPEG is ready, the auxiliary voltage VPEG may be divided to generate the first bias voltage Vbias.

Figure 8:
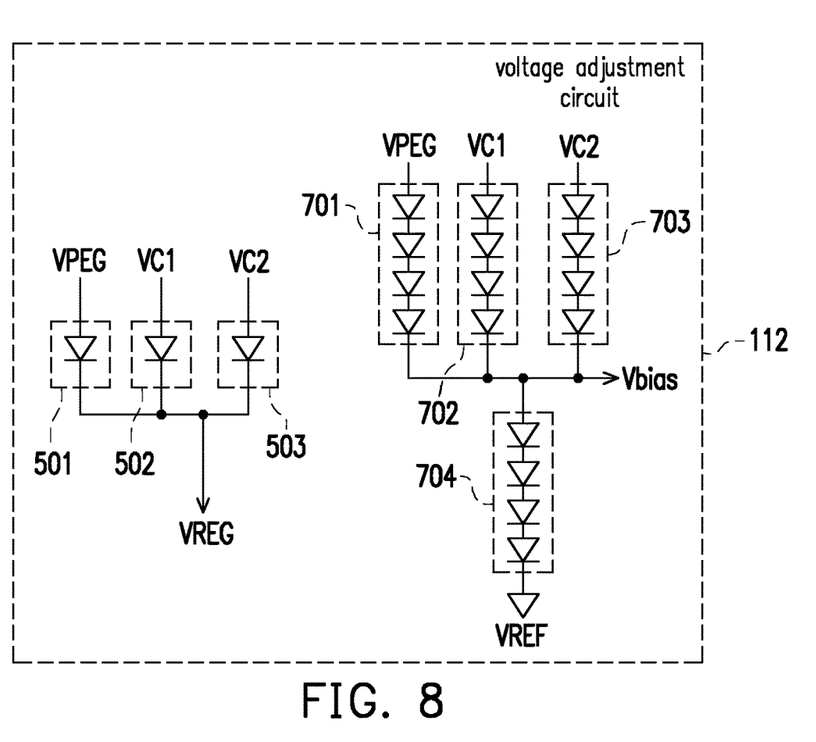
FIG. 8 is a circuit block diagram of the voltage adjustment circuit in FIG. 5 and FIG. 7 according to an embodiment of the disclosure.

FIG. 8 is a circuit block diagram of the voltage adjustment circuit 112 in FIG. 5 and FIG. 7 according to an embodiment of the disclosure. In the embodiment shown in FIG. 8, each of the voltage dividing component 501, the voltage dividing component 502 and the voltage dividing component 503 may include a diode, and each of the voltage dividing component 701, the voltage dividing component 702, the voltage dividing component 703 and the voltage dividing component 704 may include a set of series diodes. Therefore, the first bias voltage Vbias and the second bias voltage VREG are related to the auxiliary voltage VPEG, that is, the first bias voltage Vbias and the second bias voltage VREG are related to the RF signal RFC. Herein the level of the first bias voltage Vbias is lower than the level of the second bias voltage VREG.

Figure 9:
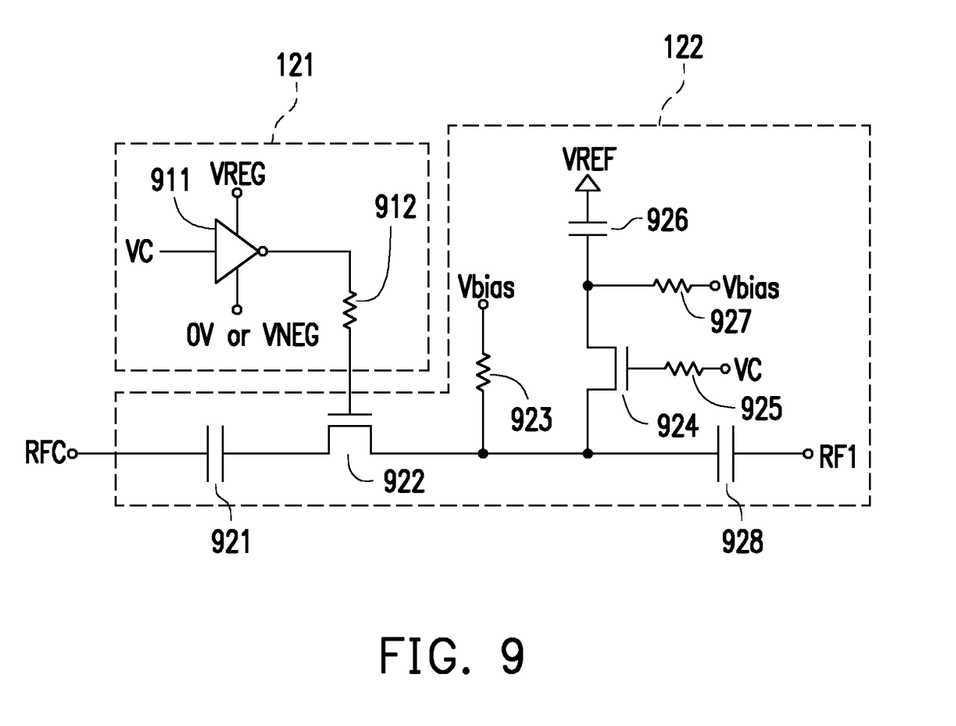
FIG. 9 is a circuit block diagram of the logic circuit and the RF transmission circuit in FIG. 2 according to an embodiment of the disclosure.

FIG. 9 is a circuit block diagram of the logic circuit 121 and the RF transmission circuit 122 in FIG. 2 according to an embodiment of the disclosure. In the embodiment shown in FIG. 9, the logic circuit 121 includes a NOT gate 911 and a resistor 912. An input terminal of the NOT gate 911 receives the control signal VC. An output terminal of the NOT gate 911 is coupled to a first terminal of the resistor 912. A second terminal of the resistor 912 is coupled to a control terminal of a RF switch 922 of the RF transmission circuit 122. Wherein, the resistor 912 may be used to choke the RF signal RFC at the input terminal so that the RF signal RFC is hardly coupled to the NOT gate 911. In this way, the operation of the NOT gate 911 is hardly affected by the RF signal RFC. In the embodiment shown in FIG. 9, a power terminal of the NOT gate 911 is coupled to the voltage generating circuit 110 to receive the second bias voltage VREG, and a reference voltage terminal of the NOT gate 911 is coupled to the voltage generating circuit 110 to receive a third bias voltage (the auxiliary voltage VNEG). In one embodiment, the second bias voltage VREG is a positive voltage, and the third bias voltage (the auxiliary voltage VNEG) is a negative voltage. In other embodiments, the power terminal of the NOT gate 911 receives the second bias voltage VREG, and the reference voltage terminal of the NOT gate 911 is coupled to the reference voltage VREF, for example, to receive a ground voltage (i.e., 0 volts). In still some other embodiments, the power terminal of the NOT gate 911 may receive the system voltage VCC, and the reference voltage terminal of the NOT gate 911 may be coupled to the voltage generating circuit 110 to receive the third bias voltage VNEG.

In the embodiment shown in FIG. 9, the RF transmission circuit 122 may serve as a single pole single throw switch. The RF transmission circuit 122 includes a capacitor 921, the RF switch 922, a bias resistor 923, a switch 924, a resistor 925, a capacitor 926 and a resistor 927. A first terminal of the capacitor 921 is coupled to the RF signal RFC. A second terminal of the capacitor 921 is coupled to a first terminal of the RF switch 922. The capacitor 921 may block a DC current but has no significant effect on an AC signal. A second terminal of the RF switch 922 is coupled to a RF output terminal RF1 of the RF transmission circuit 122 via a capacitor 928. The capacitor 928 may block a DC current but has no significant effect on an AC signal. The control terminal of the RF switch 922 is coupled to the second terminal of the resistor 912 of the logic circuit 121. A first terminal of the bias resistor 923 is coupled to the voltage generating circuit 110 to receive the first bias voltage Vbias and to provide the first bias voltage Vbias to the RF switch 922 and/or the switch 924. A second terminal of the bias resistor 923 is coupled to the second terminal of the RF switch 922.

When the control signal VC is at a high voltage level, the voltage at the control terminal of the RF switch 922 is a negative voltage (the auxiliary voltage VNEG). Therefore, the gate-source voltage of the RF switch 922 is much smaller than the threshold voltage of the RF switch 922 to ensure that the RF switch 922 is turned off. When the control signal VC is at a low voltage level, the voltage at the control terminal of the RF switch 922 is a positive voltage (the second bias voltage VREG). Since the level of the first bias voltage Vbias is lower than the level of the second bias voltage VREG, it is ensured that the RF switch 922 is turned on. When the RF switch 922 is turned on, the RF switch 922 provides the RF transmission path to transmit the RF signal RFC to a next-stage circuit (not shown).

A first terminal of the switch 924 is coupled to the second terminal of the RF switch 922. A gate of the switch 924 is controlled by the control signal VC via the resistor 925. When the control signal VC is at a high voltage level, the switch 924 is turned on to provide a shunt path that directs the RF signal RFC to the reference voltage VREF. When the control signal VC is at a low voltage level, the switch 924 is turned off to reduce the leakage of the RF signal RFC to the reference voltage VREF. A first terminal of the capacitor 926 is coupled to a second terminal of the RF switch 924. A second terminal of the capacitor 926 is coupled to the reference voltage VREF. A first terminal of the resistor 927 is coupled to the second terminal of the RF switch 924. A second terminal of the resistor 927 is coupled to the voltage generating circuit 110 to receive the first bias voltage Vbias and to provide the first bias voltage Vbias to the switch 924.

Figure 10:
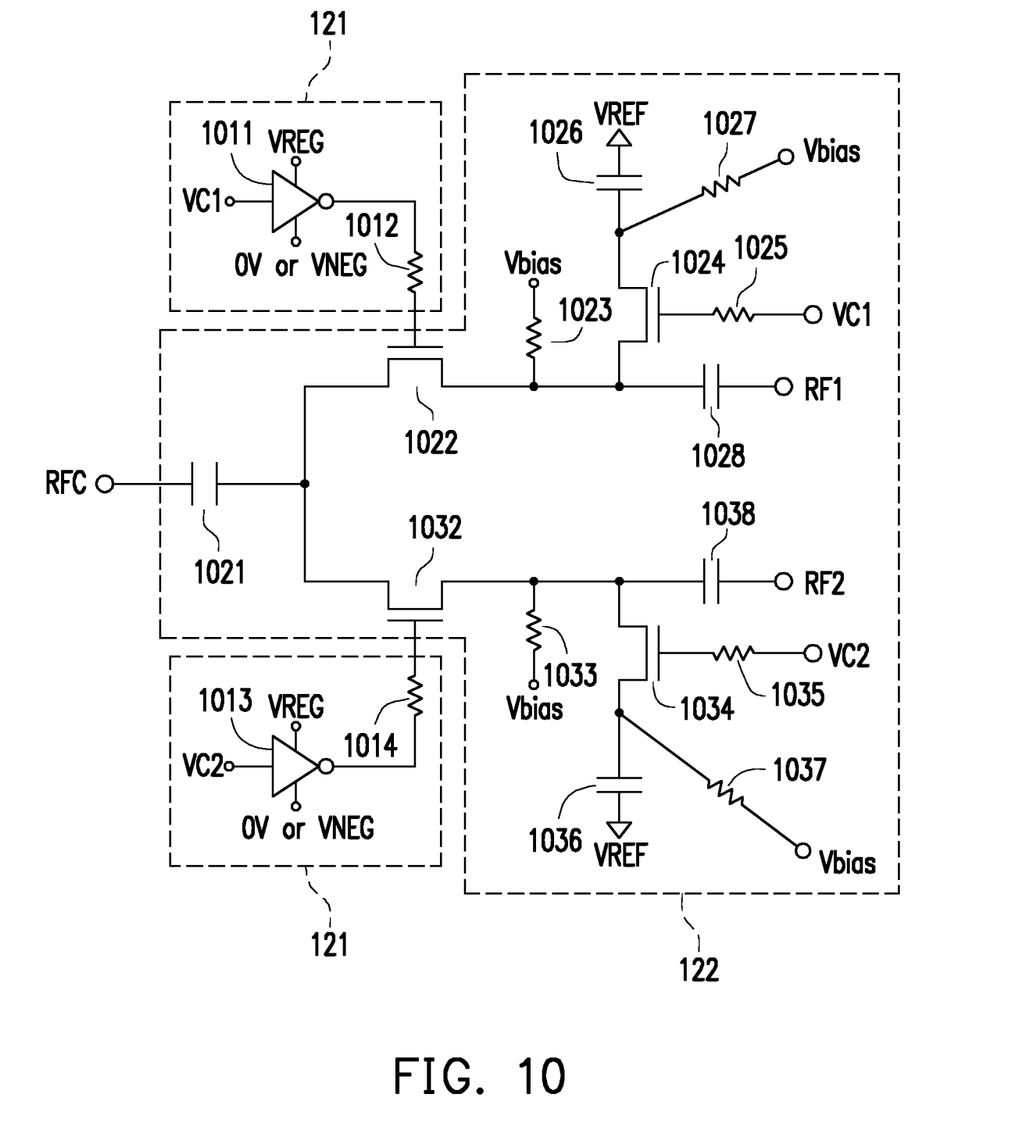
FIG. 10 is a circuit block diagram of the logic circuit and the RF transmission circuit in FIG. 2 according to another embodiment of the disclosure.

FIG. 10 is a circuit block diagram of the logic circuit 121 and the RF transmission circuit 122 in FIG. 2 according to another embodiment of the disclosure. In the embodiment shown in FIG. 10, the RF transmission circuit 122 may serve as a single pole double throw switch. That is, the RF transmission circuit 122 may selectively provide two RF transmission paths. In accordance with the teachings of FIG. 9 and FIG. 10, by analogy, the RF transmission circuit 122 in other embodiments may have more RF transmission paths. In the embodiment shown in FIG. 10, the control signal VC includes two control signals VC1 and VC2. In other embodiments, by analogy, the control signal VC may include more control signals.

In the embodiment shown in FIG. 10, the logic circuit 121 includes a NOT gate 1011, a resistor 1012, a NOT gate 1013 and a resistor 1014. An input terminal of the NOT gate 1011 receives the control signal VC1. An output terminal of the NOT gate 1011 is coupled to a first terminal of the resistor 1012. A second terminal of the resistor 1012 is coupled to a control terminal of a RF switch 1022 of the RF transmission circuit 122. An input terminal of the NOT gate 1013 receives the control signal VC2. An output terminal of the NOT gate 1013 is coupled to a first terminal of the resistor 1014. A second terminal of the resistor 1014 is coupled to a control terminal of a RF switch 1032 of the RF transmission circuit 122. The resistors 1012 and 1014 may be used to choke the RF signal RFC at the input terminal so that the RF signal RFC is hardly coupled to the NOT gates 1011 and 1013. In this way, the operation of the NOT gates 1011 and 1013 are hardly affected by the RF signal RFC.

In the embodiment shown in FIG. 10, a power terminal of the NOT gate 1011 and a power terminal of the NOT gate 1013 are coupled to the voltage generating circuit 110 to receive the second bias voltage VREG, and a reference voltage terminal of the NOT gate 1011 and a reference voltage terminal of the NOT gate 1013 are coupled to the voltage generating circuit 110 to receive a third bias voltage (the auxiliary voltage VNEG). Generally speaking, the second bias voltage VREG is a positive voltage, and the third bias voltage (the auxiliary voltage VNEG) is a negative voltage. In other embodiments, the power terminal of the NOT gate 1011 and the power terminal of the NOT gate 1013 receive the second bias voltage VREG, and the reference voltage terminal of the NOT gate 1011 and the reference voltage terminal of the NOT gate 1013 receive a ground voltage (i.e., 0 volts). In still some other embodiments, the power terminal of the NOT gate 1011 and the power terminal of the NOT gate 1013 may receive the system voltage VCC, and the reference voltage terminal of the NOT gate 1011 and the reference voltage terminal of the NOT gate 1013 may be coupled to the voltage generating circuit 110 to receive the third bias voltage VNEG.

In the embodiment shown in FIG. 10, the RF transmission circuit 122 includes a capacitor 1021, a RF switch 1022, a bias resistor 1023, a switch 1024, a resistor 1025, a capacitor 1026, a resistor 1027, a RF switch 1032, a bias resistor 1033, a switch 1034, a resistor 1035, a capacitor 1036 and a resistor 1037. A first terminal of the capacitor 1021 is coupled to the RF signal RFC. A second terminal of the capacitor 1021 is coupled to a first terminal of the RF switch 1022 and a first terminal of the RF switch 1032. A second terminal of the RF switch 1022 is coupled to a RF output terminal RF1 of the RF transmission circuit 122 via a capacitor 1028. The capacitor 1028 may block a DC current but has no significant effect on an AC signal. The control terminal of the RF switch 1022 is coupled to the second terminal of the resistor 1012 of the logic circuit 121. A first terminal of the bias resistor 1023 is coupled to the voltage generating circuit 110 to receive the first bias voltage Vbias and to provide the first bias voltage Vbias to the RF switch 1022 and/or the switch 1024. A second terminal of the bias resistor 1023 is coupled to the second terminal of the RF switch 1022. A second terminal of the RF switch 1032 is coupled to a RF output terminal RF2 of the RF transmission circuit 122 via a capacitor 1038. The capacitor 1038 may block a DC current but has no significant effect on an AC signal. The control terminal of the RF switch 1032 is coupled to the second terminal of the resistor 1014 of the logic circuit 121. A first terminal of the bias resistor 1033 is coupled to the voltage generating circuit 110 to receive the first bias voltage Vbias and to provide the first bias voltage Vbias to the RF switch 1032 and/or the switch 1034. A second terminal of the bias resistor 1033 is coupled to the second terminal of the RF switch 1032.

When the control signal VC1 is at a high voltage level, the control signal VC2 is at a low voltage level. At this time, the voltage at the control terminal of the RF switch 1022 is a negative voltage (auxiliary voltage VNEG). Since the gate-source voltage of the RF switch 1022 is much smaller than the threshold voltage of the RF switch 1022, it is ensured that the RF switch 1022 is turned off. When the control signal VC2 is at a low voltage level, the voltage at the control terminal of the RF switch 1032 is a positive voltage (the second bias voltage VREG). Since the level of the first bias voltage Vbias is lower than the level of the second bias voltage VREG, it is ensured that the RF switch 1032 is turned on. When the RF switch 1032 is turned on, the RF switch 1032 may provide the RF transmission path to transmit the RF signal RFC to a next-stage circuit (not shown).

When the control signal VC1 is at a low voltage level, the control signal VC2 is at a high voltage level. At this time, the voltage at the control terminal of the RF switch 1022 is a positive voltage (the second bias voltage VREG). Since the level of the first bias voltage Vbias is lower than the level of the second bias voltage VREG, it is ensured that the RF switch 1022 is turned on. When the RF switch 1022 is turned on, the RF switch 1022 may provide the RF transmission path to transmit the RF signal RFC to a next-stage circuit (not shown). When the control signal VC2 is at a high voltage level, the voltage at the control terminal of the RF switch 1032 is a negative voltage (the auxiliary voltage VNEG). Since the gate-source voltage of the RF switch 1032 is much smaller than the threshold voltage of the RF switch 1032, it is ensured that the RF switch 1032 is turned off.

A first terminal of the switch 1024 is coupled to the second terminal of the RF switch 1022. A gate of the switch 1024 is controlled by the control signal VC1 via the resistor 1025. A first terminal of the switch 1034 is coupled to the second terminal of the RF switch 1032. A gate of the switch 1034 is controlled by the control signal VC2 via the resistor 1035. When the control signal VC1 is at a high voltage level, the control signal VC2 is at a low voltage level. At this time, the switch 1024 is turned on to provide a shunt path that directs the RF signal RFC to the reference voltage VREF, and the switch 1034 is turned off to reduce the leakage of the RF signal RFC to the reference voltage VREF. When the control signal VC1 is at a low voltage level, the control signal VC2 is at a high voltage level. At this time, the switch 1024 is turned off to reduce the leakage of the RF signal RFC to the reference voltage VREF, and the switch 1034 is turned on to provide a shunt path that directs the RF signal RFC to the reference voltage VREF.

A first terminal of the capacitor 1026 is coupled to a second terminal of the switch 1024. A second terminal of the capacitor 1026 is coupled to the reference voltage VREF. A first terminal of the resistor 1027 is coupled to the second terminal of the switch 1024. A second terminal of the resistor 1027 is coupled to the voltage generating circuit 110 to receive the first bias voltage Vbias and to provide the first bias voltage Vbias to the switch 1024. A first terminal of the capacitor 1036 is coupled to a second terminal of the switch 1034. A second terminal of the capacitor 1036 is coupled to the reference voltage VREF. A first terminal of the resistor 1037 is coupled to the second terminal of the switch 1034. A second terminal of the resistor 1037 is coupled to the voltage generating circuit 110 to receive the first bias voltage Vbias and to provide the first bias voltage Vbias to the switch 1034.

In summary, in the embodiments of the disclosure, the RF device 100 includes the voltage generating circuit 110 and the RF circuit 120. The voltage generating circuit 110 may generate the bias voltage VB related to the RF signal RFC and provide the bias voltage VB to the RF circuit 120. According to design requirements, the bias voltage VB may include one or more of the first bias voltage Vbias, the second bias voltage VREG and the third bias voltage (the auxiliary voltage VNEG). The RF circuit 120 uses the bias voltage VB to operate the conduction state of the RF transmission path of the RF circuit 120 so as to selectively transmit the RF signal RFC to a next-stage circuit (not shown).

Although the embodiments are already disclosed as above, these embodiments should not be construed as limitations on the scope of the disclosure. It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A radio frequency device, comprising:
   a voltage generating circuit adapted to receive a radio frequency signal, wherein the voltage generating circuit, by using the radio frequency signal, generates at least one bias voltage related to the radio frequency signal; and
   a radio frequency circuit adapted to receive the radio frequency signal and coupled to the voltage generating circuit to receive the at least one bias voltage, wherein the radio frequency circuit comprises at least one radio frequency transmission path, and the at least one bias voltage is adapted to operate a conduction state of the at least one radio frequency transmission path,
   wherein the voltage generating circuit comprises:
     a rectification circuit adapted to receive the radio frequency signal, wherein the rectification circuit generates at least one auxiliary voltage related to the radio frequency signal; and
     a voltage adjustment circuit coupled to the rectification circuit to receive the at least one auxiliary voltage, and generating a first bias voltage or a second bias voltage of the at least one bias voltage to provide the first bias voltage or the second bias voltage to the radio frequency circuit, wherein the first bias voltage and the second bias voltage are related to the at least one auxiliary voltage,
   wherein the at least one auxiliary voltage comprises an upper half-wave auxiliary voltage related to an upper half-wave part of the radio frequency signal, or a lower half-wave auxiliary voltage related to a lower half-wave part of the radio frequency signal.

2. The radio frequency device as claimed in claim 1, wherein the rectification circuit comprises:
   a first capacitor having a first terminal coupled to the radio frequency signal;
   a diode having an anode coupled to a second terminal of the first capacitor, wherein a cathode of the diode is coupled to a reference voltage;
   a resistor having a first terminal coupled to the second terminal of the first capacitor, wherein a second terminal of the resistor provides the lower half-wave auxiliary voltage to the radio frequency circuit to serve as a third bias voltage of the at least one bias voltage; and
   a second capacitor having a first terminal coupled to the second terminal of the resistor, wherein a second terminal of the second capacitor is coupled to the reference voltage.

3. The radio frequency device as claimed in claim 1, wherein the rectification circuit comprises:
- a first capacitor having a first terminal coupled to the radio frequency signal;
- a diode having a cathode coupled to a second terminal of the first capacitor, wherein an anode of the diode is coupled to a reference voltage;
- a resistor having a first terminal coupled to the second terminal of the first capacitor, wherein a second terminal of the resistor provides the upper half-wave auxiliary voltage to the voltage adjustment circuit; and
- a second capacitor having a first terminal coupled to the second terminal of the resistor, wherein a second terminal of the second capacitor is coupled to the reference voltage.

4. The radio frequency device as claimed in claim 1, wherein the voltage adjustment circuit generates the first bias voltage or the second bias voltage according to a system voltage and the at least one auxiliary voltage, and provides the first bias voltage or the second bias voltage to the radio frequency circuit.

5. The radio frequency device as claimed in claim 1, wherein the voltage adjustment circuit generates the first bias voltage or the second bias voltage according to a plurality of control signals and the at least one auxiliary voltage, and provides the first bias voltage or the second bias voltage to the radio frequency circuit.

6. The radio frequency device as claimed in claim 5, wherein the voltage adjustment circuit outputs one of the plurality of control signals and the at least one auxiliary voltage which has a higher voltage to the radio frequency circuit to serve as the first bias voltage or the second bias voltage.

7. The radio frequency device as claimed in claim 5, wherein the voltage adjustment circuit comprises:
- a first voltage dividing component having a first terminal coupled to the rectification circuit to receive the at least one auxiliary voltage;
- a second voltage dividing component having a first terminal that receives a first control signal of the plurality of control signals, wherein a second terminal of the second voltage dividing component is coupled to a second terminal of the first voltage dividing component; and
- a third voltage dividing component having a first terminal that receives a second control signal of the plurality of control signals, wherein a second terminal of the third voltage dividing component is coupled to the second terminal of the first voltage dividing component;
- wherein the second terminal of the first voltage dividing component provides the second bias voltage to the radio frequency circuit.

8. The radio frequency device as claimed in claim 5, wherein the voltage adjustment circuit comprises:
- a first voltage dividing component having a first terminal coupled to the rectification circuit to receive the at least one auxiliary voltage, wherein a second terminal of the first voltage dividing component is coupled to a voltage dividing node, and the voltage dividing node provides the first bias voltage to the radio frequency circuit;
- a second voltage dividing component having a first terminal that receives a first control signal of the plurality of control signals, wherein a second terminal of the second voltage dividing component is coupled to the voltage dividing node;
- a third voltage dividing component having a first terminal that receives a second control signal of the plurality of control signals, wherein a second terminal of the third voltage dividing component is coupled to the voltage dividing node; and
- a fourth voltage dividing component having a first terminal coupled to the voltage dividing node, wherein a second terminal of the fourth voltage dividing component is coupled to a reference voltage.

9. The radio frequency device as claimed in claim 8, wherein the first voltage dividing component comprises a first resistor, a first set of series resistors, a first diode or a first set of series diodes, the second voltage dividing component comprises a second resistor, a second set of series resistors, a second diode or a second set of series diodes, the third voltage dividing component comprises a third resistor, a third set of series resistors, a third diode or a third set of series diodes, and the fourth voltage dividing component comprises a fourth resistor, a fourth set of series resistors, a fourth diode or a fourth set of series diodes.

10. The radio frequency device as claimed in claim 1, wherein the first bias voltage and the second bias voltage are related to the radio frequency signal, and a level of the first bias voltage is lower than a level of the second bias voltage.

11. A radio frequency device, comprising:
- a voltage generating circuit adapted to receive a radio frequency signal, wherein the voltage generating circuit, by using the radio frequency signal, generates at least one bias voltage related to the radio frequency signal; and
- a radio frequency circuit adapted to receive the radio frequency signal and coupled to the voltage generating circuit to receive the at least one bias voltage, wherein the radio frequency circuit comprises at least one radio frequency transmission path, and the at least one bias voltage is adapted to operate a conduction state of the at least one radio frequency transmission path,
- wherein the radio frequency circuit comprises:
  - a radio frequency transmission circuit adapted to receive the radio frequency signal and determining whether to transmit the radio frequency signal via the at least one radio frequency transmission path; and
  - a logic circuit coupled to the voltage generating circuit to receive the at least one bias voltage, wherein the logic circuit controls the conduction state of the at least one radio frequency transmission path in the radio frequency transmission circuit according to at least one control signal.

12. The radio frequency device as claimed in claim 11, wherein the radio frequency transmission circuit comprises a first capacitor and a first radio frequency switch, the logic circuit comprises a first NOT gate,
- a first terminal of the first capacitor is adapted to couple the radio frequency signal,
- a first terminal of the first radio frequency switch is coupled to a second terminal of the first capacitor, and a second terminal of the first radio frequency switch is coupled to a first radio frequency output terminal of the radio frequency transmission circuit,
- the first radio frequency switch, when turned on, provides a first radio frequency transmission path of the at least one radio frequency transmission path, and
- an input terminal of the first NOT gate is adapted to receive a first control signal of the at least one control signal, and an output terminal of the first NOT gate is coupled to a control terminal of the first radio frequency switch,
- wherein a power terminal of the first NOT gate is coupled to the voltage generating circuit to receive a second bias voltage of the at least one bias voltage, or a reference voltage terminal of the first NOT gate is coupled to the voltage generating circuit to receive a third bias voltage of the at least one bias voltage.

13. The radio frequency device as claimed in claim 12, wherein the radio frequency transmission circuit further comprises:
a bias resistor having a first terminal coupled to the voltage generating circuit to receive a first bias voltage of the at least one bias voltage, wherein a second terminal of the bias resistor is coupled to the second terminal of the first radio frequency switch.

14. The radio frequency device as claimed in claim 13, wherein the radio frequency transmission circuit further comprises:
a switch having a first terminal coupled to the second terminal of the first radio frequency switch, wherein a gate of the switch is controlled by the first control signal;
a second capacitor having a first terminal coupled to a second terminal of the switch, wherein a second terminal of the second capacitor is coupled to a reference voltage; and
a resistor having a first terminal coupled to the second terminal of the switch, wherein a second terminal of the resistor is coupled to the voltage generating circuit to receive the first bias voltage.

15. The radio frequency device as claimed in claim 12, wherein the radio frequency transmission circuit further comprises a second radio frequency switch, the logic circuit further comprises a second NOT gate,
a first terminal of the second radio frequency switch is coupled to the second terminal of the first capacitor, a second terminal of the second radio frequency switch is coupled to a second radio frequency output terminal of the radio frequency transmission circuit, and
an input terminal of the second NOT gate is adapted to receive a second control signal of the at least one control signal, and an output terminal of the second NOT gate is coupled to a control terminal of the second radio frequency switch,
wherein a power terminal of the second NOT gate is coupled to the voltage generating circuit to receive the second bias voltage, or a reference voltage terminal of the second NOT gate is coupled to the voltage generating circuit to receive the third bias voltage.

16. The radio frequency device as claimed in claim 15, wherein the radio frequency transmission circuit further comprises:
a bias resistor having a first terminal coupled to the voltage generating circuit to receive a first bias voltage of the at least one bias voltage, wherein a second terminal of the bias resistor is coupled to the second terminal of the second radio frequency switch.

17. The radio frequency device as claimed in claim 16, wherein the radio frequency transmission circuit further comprises:
a switch having a first terminal coupled to the second terminal of the second radio frequency switch, wherein a gate of the switch is controlled by the second control signal;
a second capacitor having a first terminal coupled to a second terminal of the switch, wherein a second terminal of the second capacitor is coupled to the reference voltage; and
a resistor having a first terminal coupled to the second terminal of the switch, wherein a second terminal of the resistor is coupled to the voltage generating circuit to receive the first bias voltage.

18. A voltage generating circuit, comprising:
a rectification circuit having an input terminal adapted to receive a radio frequency signal, wherein the rectification circuit generates at least one auxiliary voltage related to the radio frequency signal; and
a voltage adjustment circuit having at least one output terminal adapted to generate at least one bias voltage related to the radio frequency signal and provide the at least one bias voltage to a radio frequency circuit, wherein the at least one bias voltage is adapted to operate a conduction state of at least one radio frequency transmission path of the radio frequency circuit,
wherein the voltage adjustment circuit coupled to the rectification circuit to receive the at least one auxiliary voltage, and generating a first bias voltage or a second bias voltage of the at least one bias voltage to provide the first bias voltage or the second bias voltage to the radio frequency circuit, wherein the first bias voltage and the second bias voltage are related to the at least one auxiliary voltage; and
wherein the at least one auxiliary voltage comprises an upper half-wave auxiliary voltage related to an upper half-wave part of the radio frequency signal, or a lower half-wave auxiliary voltage related to a lower half-wave part of the radio frequency signal.

* * * * *